United States Patent
Sohn et al.

(10) Patent No.: US 9,214,343 B2
(45) Date of Patent: Dec. 15, 2015

(54) ZNSNO3/ZNO NANOWIRE HAVING CORE-SHELL STRUCTURE, METHOD OF FORMING ZNSNO3/ZNO NANOWIRE AND NANOGENERATOR INCLUDING ZNSNO3/ZNO NANOWIRE, AND METHOD OF FORMING ZNSNO3 NANOWIRE AND NANOGENERATOR INCLUDING ZNSNO3 NANOWIRE

(75) Inventors: Jung-inn Sohn, Hwaseong-si (KR); Seung-Nam Cha, Seoul (KR); Sung-min Kim, Seoul (KR); Sang-woo Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 427 days.

(21) Appl. No.: 13/489,200

(22) Filed: Jun. 5, 2012

(65) Prior Publication Data

US 2013/0038178 A1 Feb. 14, 2013

(30) Foreign Application Priority Data

Aug. 8, 2011 (KR) .................. 10-2011-0078747

(51) Int. Cl.
*H01L 41/08* (2006.01)
*H01L 21/02* (2006.01)
(Continued)

(52) U.S. Cl.
CPC ...... *H01L 21/02645* (2013.01); *H01L 21/0237* (2013.01); *H01L 21/02472* (2013.01); *H01L 21/02483* (2013.01); *H01L 21/02513* (2013.01); *H01L 21/02554* (2013.01); *H01L 21/02603* (2013.01); *H01L 21/02631* (2013.01);
(Continued)

(58) Field of Classification Search
CPC ............... H02N 2/18; H01L 21/02472; H01L 21/02483; H01L 21/02554; H01L 21/02603; H01L 21/02645; H01L 21/0263; H01L 29/0673; H01L 29/0676; H01L 29/068
USPC .................. 310/358, 339, 311, 300, 367; 257/E21.461, E29.097, E33.003, 257/E33.008, 12
IPC .............................. H01L 21/36, 29/225, 41/113
See application file for complete search history.

(56) References Cited

U.S. PATENT DOCUMENTS

2007/0040480 A1* 2/2007 Schurz et al. ............... 310/366

FOREIGN PATENT DOCUMENTS

KR  10-2008-0017604 A  2/2008
KR  10-2008-0027276 A  3/2008

(Continued)

OTHER PUBLICATIONS

In-Sung Hwang [Synthesis and gas sensing characteristic of highly crystalline ZnO—SnOsub2 Mar. 25, 2010 p. 595-600].*

(Continued)

*Primary Examiner* — Thomas Dougherty
*Assistant Examiner* — Karen B Addison
(74) *Attorney, Agent, or Firm* — Sughrue Mion, PLLC

(57) ABSTRACT

A $ZnSnO_3$/ZnO nanowire, a method of forming a $ZnSnO_3$/ZnO nanowire, a nanogenerator including a $ZnSnO_3$/ZnO nanowire, a method of forming a $ZnSnO_3$ nanowire, and a nanogenerator including a $ZnSnO_3$ nanowire are provided. The $ZnSnO_3$/ZnO nanowire includes a core and a shell that surrounds the core, wherein the core includes $ZnSnO_3$ and the shell includes ZnO.

4 Claims, 9 Drawing Sheets

(51) Int. Cl.
*H01L 41/113* (2006.01)
*H01L 41/18* (2006.01)
*H01L 29/06* (2006.01)

(52) U.S. Cl.
CPC .............. *H01L41/113* (2013.01); *H01L 41/18* (2013.01); *H01L 29/068* (2013.01); *H01L 29/0673* (2013.01); *H01L 29/0676* (2013.01)

(56) References Cited

FOREIGN PATENT DOCUMENTS

| KR | 10-2010-0046634 A | 5/2010 |
|---|---|---|
| KR | 10-2010-0064194 A | 6/2010 |
| KR | 10-2011-0011167 A | 2/2011 |
| KR | 10-2011-0020145 A | 3/2011 |
| KR | 10-2011-0021637 A | 3/2011 |

OTHER PUBLICATIONS

X.Y.Xeu [Electronic transport characteristics through individual ZnSnO3 nanowires ] ; Applied Physics Letters vol. 88182102-103(2006).*

X.Y.Xeu [Electronic transport characteristics through individual ZnSnO3 nanowires ] • Applied Physics Letters vol. 88182102-103(2006).*

Wang, Z. L. "Towards Self-Powered Nanosystems: from Nanogenerators to Nanopiezotronics." *Advanced Functional Materials*, 2008, pp. 3553-3567, vol. 18.

Fouad, O. A. et al., "Growth and Characterization of ZnO, SnO2 and ZnO/SnO2 Nanostructures from the Vapor Phase," Top Catal, vol. 47, Feb. 6, 2008, pp. 84-96.

\* cited by examiner

ZNSNO3/ZNO NANOWIRE HAVING CORE-SHELL STRUCTURE, METHOD OF FORMING ZNSNO3/ZNO NANOWIRE AND NANOGENERATOR INCLUDING ZNSNO3/ZNO NANOWIRE, AND METHOD OF FORMING ZNSNO3 NANOWIRE AND NANOGENERATOR INCLUDING ZNSNO3 NANOWIRE

CROSS-REFERENCE TO RELATED APPLICATIONS

This application claims priority from Korean Patent Application No. 10-2011-0078747, filed on Aug. 8, 2011 in the Korean Intellectual Property Office, the disclosure of which is incorporated herein in its entirety by reference.

BACKGROUND

1. Field

The present disclosure relates to $ZnSnO_3/ZnO$ nanowires having core-shell structure, methods of forming $ZnSnO_3/ZnO$ nanowires and nanogenerators including $ZnSnO_3/ZnO$ nanowires, and methods of forming $ZnSnO_3$ nanowires and nanogenerators including $ZnSnO_3$ nanowires.

2. Description of the Related Art

Technology for harvesting energy is currently drawing attention. Among devices for harvesting energy, energy generators that use piezoelectric characteristics may be new eco-friendly energy generators that may convert mechanical energy generated from fine vibration or human movement into electrical energy and may extract the electrical energy, unlike other generators, such as solar cells, wind power generators, fuel cells, and the like. Due to the development of nano-technologies, nano-sized devices can be more easily manufactured. However, batteries that are mainly used in supplying power occupy a greater area than that of nano-sized devices and the performance and independent driving of nano-sized devices are limited as the life-span of batteries is limited.

In order to address these problems, nanogenerators that use a nano-sized piezoelectric material have been developed. However, nanogenerators that use piezoelectric characteristics are generally manufactured using a zinc oxide (ZnO) piezoelectric material and thus, the energy efficiency of nanogenerators is low.

SUMMARY

Embodiments provide $ZnSnO_3/ZnO$ nanowires having a core-shell structure, methods of forming $ZnSnO_3/ZnO$ nanowires and nanogenerators including $ZnSnO_3/ZnO$ nanowires, and methods of forming $ZnSnO_3$ nanowires and nanogenerators including $ZnSnO_3$ nanowires.

According to an aspect of an embodiment, there is provided a $ZnSnO_3/ZnO$ nanowire including a core and a shell that surrounds the core, wherein the core includes $ZnSnO_3$ and the shell includes ZnO.

The $ZnSnO_3$ may have a Perovskite crystal structure, and the ZnO may have a hexagonal crystal structure.

The $ZnSnO_3/ZnO$ nanowire may be formed by thermal chemical vapor deposition (CVD).

According to an aspect of another embodiment, there is provided a method of forming a $ZnSnO_3/ZnO$ nanowire, the method including: mixing ZnO powder, SnO powder, and carbon powder at a predetermined ratio; disposing a substrate and the mixed powder in a furnace to be spaced apart from each other; and growing, on the substrate by heating the mixed powder, a $ZnSnO_3/ZnO$ nanowire including a core including $ZnSnO_3$ and a shell that surrounds the core and that includes ZnO.

The substrate may include a monocrystalline Si, sapphire, ZnO, or $ZnSnO_3$.

The method may further include forming a catalyst layer on the substrate. The catalyst layer may include a noble metal, a transition metal, or a transition metal oxide. For example, the catalyst layer may include Zn, ZnO, or $ZnSnO_3$.

The growing of the $ZnSnO_3/ZnO$ nanowire may include: heating the mixed powder in the furnace up to a first temperature to vaporize the mixed powder; and growing the $ZnSnO_3/ZnO$ nanowire on the substrate while maintaining the first temperature for a predetermined amount of time. The first temperature may range, for example, from 800° C. to 1200° C., preferably, from 900° C. to 1100° C.

The method may further include flowing an inert gas into the furnace after the mixed powder is heated up to a second temperature that is lower than the first temperature. The second temperature may range, for example, from 200° C. to 400° C., preferably from 260° C. to 330° C.

According to an aspect of another embodiment, there is provided a method of forming a $ZnSnO_3$ nanowire includes: mixing ZnO powder, SnO powder, and carbon powder at a predetermined ratio; disposing a substrate and the mixed powder in a furnace to be spaced apart from each other; and growing a $ZnSnO_3$ nanowire on the substrate by heating the mixed powder.

The substrate may include a monocrystalline Si, sapphire, ZnO, or $ZnSnO_3$.

The method may further include forming a catalyst layer on the substrate. The catalyst layer may include Zn, ZnO, or $ZnSnO_3$.

According to an aspect of another embodiment, there is provided a nanogenerator including at least one $ZnSnO_3/ZnO$ nanowire, the at least one $ZnSnO_3/ZnO$ nanowire including a core and a shell that surrounds the core, wherein the core includes $ZnSnO_3$ and the shell includes ZnO.

The nanogenerator may further include: a substrate; a first electrode disposed spaced apart from the substrate; and the at least one $ZnSnO_3/ZnO$ nanowire disposed between the substrate and the first electrode.

The substrate may include a conductive material.

A second electrode may be formed on the substrate, and the at least one $ZnSnO_3/ZnO$ nanowire may be disposed between the first electrode and the second electrode. The at least one $ZnSnO_3/ZnO$ nanowire may be disposed perpendicular to the substrate or inclined from the substrate at a predetermined angle.

The nanogenerator may further include: a plurality of electrodes disposed on a same plane to be spaced apart from one another; and the at least one $ZnSnO_3/ZnO$ nanowire disposed between the plurality of electrodes.

The electrodes may be disposed parallel to one another by a predetermined distance. The at least one $ZnSnO_3/ZnO$ nanowire may be disposed perpendicular to the electrodes or inclined from the electrodes at a predetermined angle. The electrodes may be connected to one another in series, and the electrodes and the at least one $ZnSnO_3/ZnO$ nanowire may be disposed on the substrate.

According to an aspect of another embodiment, there is provided a nanogenerator including at least one $ZnSnO_3$ nanowire.

The nanogenerator may further include: a substrate; a first electrode disposed spaced apart from the substrate; and the at least one ZnSnO₃ nanowire disposed between the substrate and the first electrode.

The nanogenerator may further include: a plurality of electrodes disposed on a same plane to be spaced apart from one another; and the at least one ZnSnO₃ nanowire disposed between the plurality of electrodes.

BRIEF DESCRIPTION OF THE DRAWINGS

The above and/or other aspects will become apparent and more readily appreciated from the following description of the embodiments, taken in conjunction with the accompanying drawings in which.

DETAILED DESCRIPTION

Figure 1:
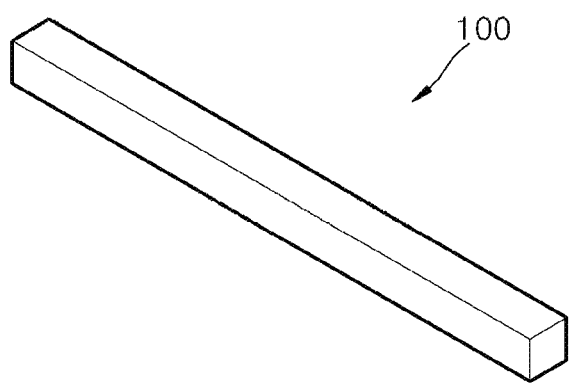
FIG. 1 is a perspective view of a ZnSnO₃ nanowire.

Reference will now be made in detail to exemplary embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. In the drawings, the thicknesses of layers and regions may be exaggerated for clarity.

FIG. 1 is a perspective view of a ZnSnO₃ nanowire 100. Referring to FIG. 1, the ZnSnO₃ nanowire 100 has a Perovskite crystal structure that has a rectangular cross-section. The ZnSnO₃ nanowire 100 is formed of a semiconductor material having excellent piezoelectric characteristics. Generally, materials that have a Perovskite crystal structure are well-known to have high piezoelectric efficiency, and the ZnSnO₃ nanowire 100 has more excellent piezoelectric characteristics than those of a ZnO nanowire. The ZnSnO₃ nanowire 100 may be formed by being grown using a chemical vapor deposition (CVD), specifically, thermal CVD, as will be described below.

Figure 2:
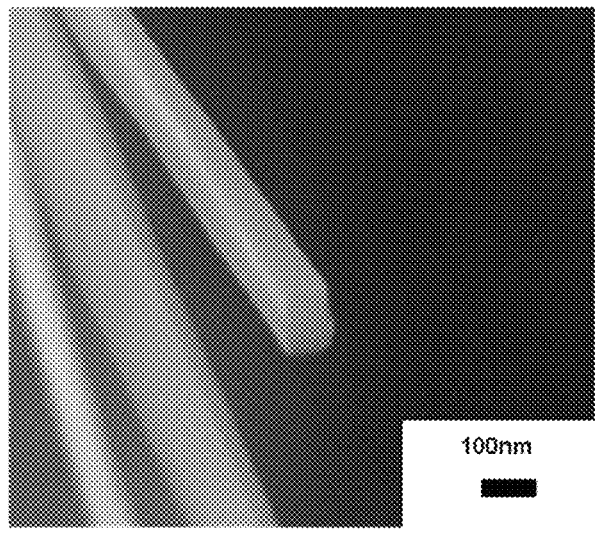
FIG. 2 is a field emission-scanning electron microscope (FE-SEM) image of a ZnSnO₃ nanowire according to an exemplary embodiment.
Figure 3:
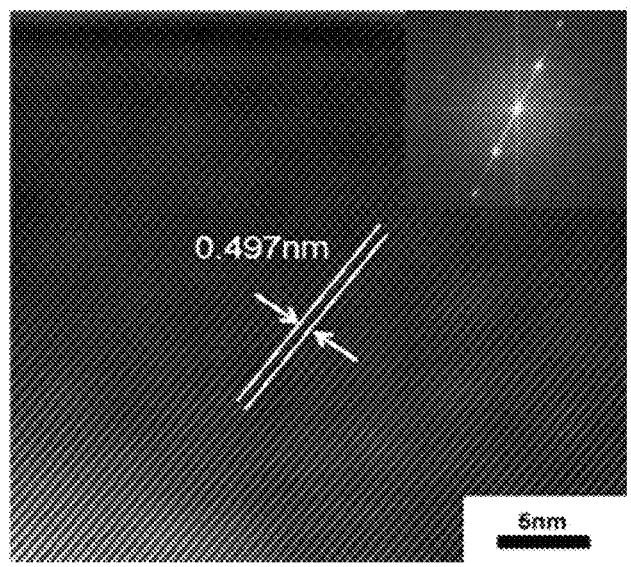
FIG. 3 is a high resolution-transmission electron microscope (HR-TEM) image of a ZnSnO₃ nanowire according to an exemplary embodiment.

FIG. 2 is a field emission-scanning electron microscope (FE-SEM) image of a ZnSnO₃ nanowire according to an exemplary embodiment. FIG. 3 is a high resolution-transmission electron microscope (HR-TEM) image of a ZnSnO₃ nanowire according to an exemplary embodiment. The ZnSnO₃ nanowires illustrated in FIGS. 2 and 3 are grown in a [111] crystal direction. Referring to FIGS. 2 and 3, each of the ZnSnO₃ nanowires has a rectangular cross-section and has a Perovskite crystal structure. Also, as a result of X-ray diffraction (XRD) and HR-TEM analysis, a distance between (111) crystal planes of the ZnSnO₃ nanowires was measured as approximately 0.497 nm.

Figure 4:
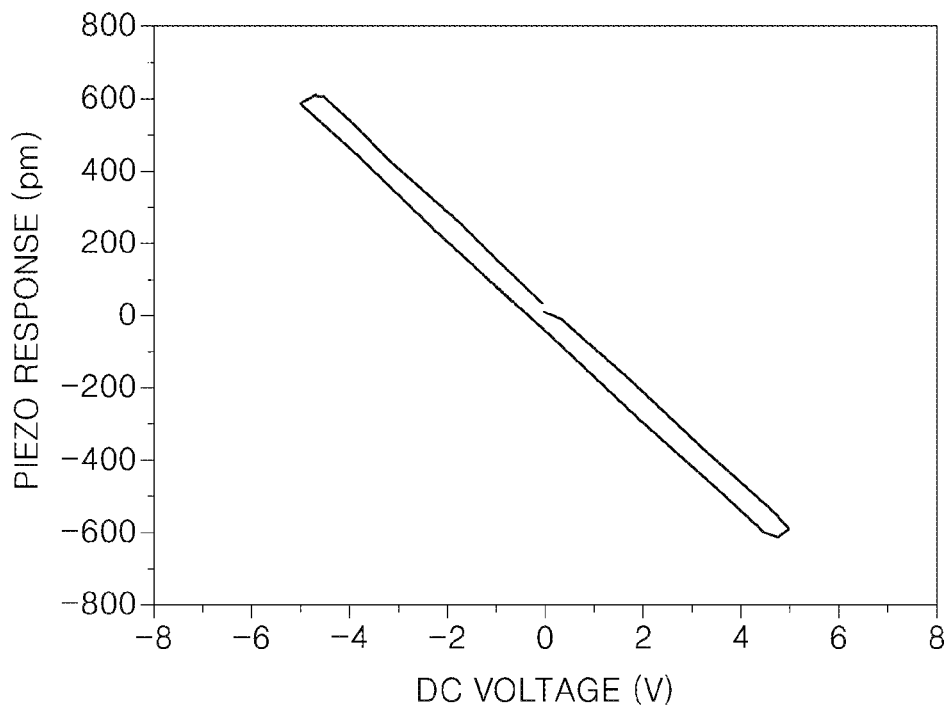
FIG. 4 is a graph showing the measurement result of piezo force microscope (PFM) of the ZnSnO₃ nanowire illustrated in FIGS. 2 and 3.

FIG. 4 is a graph showing the measurement result of piezo force microscope (PFM) of the ZnSnO₃ nanowires illustrated in FIGS. 2 and 3. Referring to FIG. 4, according to the measurement result, a piezoelectric constant d31 of the ZnSnO₃ nanowires illustrated in FIGS. 2 and 3 was approximately 124 pm/V. Since a piezoelectric constant d31 of ZnO nanowires is approximately 13.5 pm/V, piezoelectric characteristics of the ZnSnO₃ nanowires illustrated in FIGS. 2 and 3 are more excellent, approximately 9 times better than those of the ZnO nanowires. Also, lead zirconate titanate (PZT) that is mainly used as a piezoelectric material has a high piezoelectric efficiency but includes lead (Pb), which is harmful to the human body. However, the ZnSnO₃ nanowires have a similar piezoelectric efficiency to that of PZT and are chemically stable and thus are harmless to the human body. Thus, a nanogenerator that is manufactured using a ZnSnO₃ nanowire may be applied to an eco-friendly field or the human body.

Figure 5:
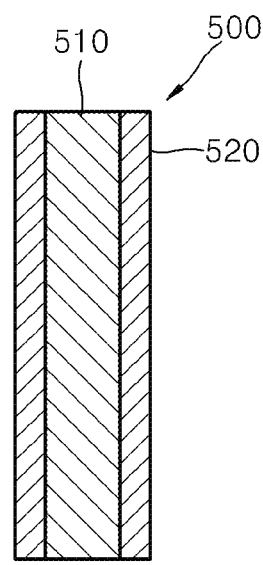
FIG. 5 is a cross-sectional view of a ZnSnO₃/ZnO nanowire having a core-shell structure, according to an exemplary embodiment.

There are ZnSnO₃/ZnO nanowires having a core-shell structure, having excellent piezoelectric characteristics, and which are harmless to the human body. FIG. 5 is a cross-sectional view of a ZnSnO₃/ZnO nanowire 500 having a core-shell structure, according to an exemplary embodiment. Referring to FIG. 5, the ZnSnO₃/ZnO nanowire 500 has a core-shell structure including a ZnSnO₃ core 510 and a ZnO shell 520 that surrounds the ZnSnO₃ core 510. The ZnSnO₃ core 510 has a nanowire shape and a Perovskite crystal structure that has excellent piezoelectric characteristics. The ZnO shell 520 surrounds an outer surface of the ZnSnO₃ core 510 and has a hexagonal crystal structure.

Figure 6:
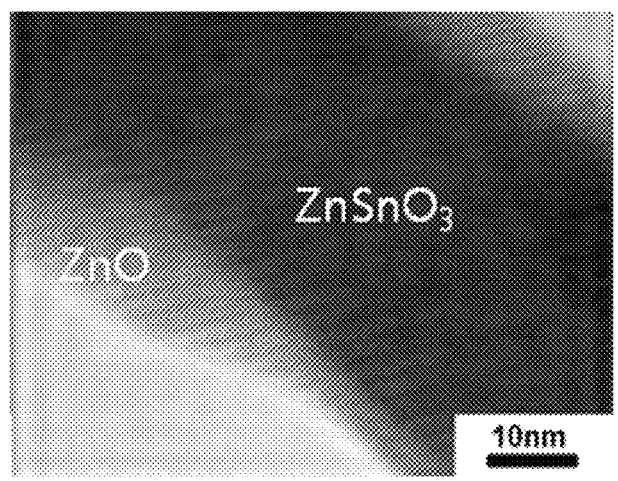
FIG. 6 is an HR-TEM image of a ZnSnO₃ core and a ZnO shell of a ZnSnO₃/ZnO nanowire formed using thermal chemical vapor deposition (CVD)

The ZnSnO₃/ZnO nanowire 500 having a core-shell structure has more excellent piezoelectric characteristics than those of a ZnO nanowire, such as the ZnSnO₃ nanowire 100 described above, and does not include any material that is harmful to the human body. Thus, a nanogenerator that is manufactured using the ZnSnO₃/ZnO nanowire 500 having a core-shell structure may be applied in an eco-friendly field or the human body. As will be described below, the ZnSnO₃/ZnO nanowire 500 having a core-shell structure may be formed by being grown using a method, for example, CVD, specifically, thermal CVD, which is the same as the method used by the ZnSnO₃ nanowire 100. FIG. 6 is an HR-TEM image of a ZnSnO$_3$ core and a ZnO shell of a ZnSnO$_3$/ZnO nanowire formed using thermal CVD.

Figure 7A:
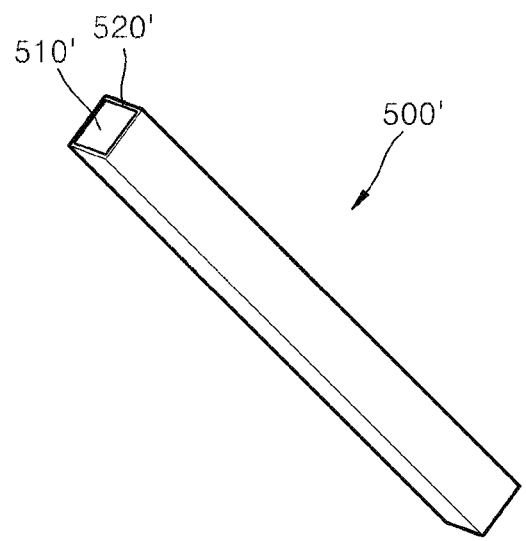
FIGS. 7A and 7B are perspective views of exemplary shapes of a ZnSnO₃/ZnO nanowire having a core-shell structure, according to an exemplary embodiment.
Figure 7B:
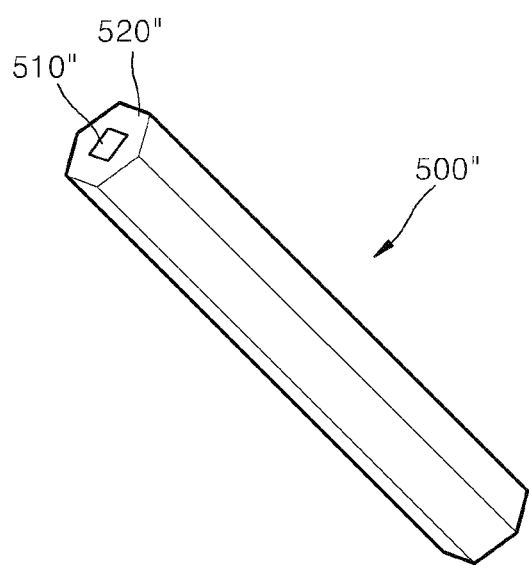

In the ZnSnO$_3$/ZnO nanowire 500 having a core-shell structure, the ZnSnO$_3$ core 510 and the ZnO shell 520 may have various shapes according to growth conditions. Since the shape of the ZnSnO$_3$/ZnO nanowire 500 cannot be defined due to the various shapes of the ZnSnO$_3$ core 510 and the ZnO shell 520, FIG. 5 illustrates only a cross-section of the ZnSnO$_3$/ZnO nanowire 500, for convenience of explanation. FIGS. 7A and 7B illustrate exemplary shapes 500' and 500'' of the ZnSnO$_3$/ZnO nanowire 500.

In the ZnSnO$_3$/ZnO nanowire 500 having a core-shell structure, the ZnSnO$_3$ core 510 has a Perovskite crystal structure and thus may basically have a rectangular cross-section, and the ZnO shell 520 has a hexagonal crystal structure and thus may basically have a hexagonal cross-section. As illustrated in FIG. 7A, when a ZnO shell 520' having a very small thickness is formed on a ZnSnO$_3$ core 510' having a rectangular cross-section, the ZnO shell 520' may be formed to have a rectangular cross-sectional shape that surrounds an outer surface of the ZnSnO$_3$ core 510'. Also, as illustrated in FIG. 7B, when a ZnO shell 520'' having a very large thickness is formed on a ZnSnO$_3$ core 510'' having a rectangular cross-section, the ZnO shell 520'' may be formed to have a hexagonal cross-sectional shape that surrounds an outer surface of the ZnSnO$_3$ core 510''. However, the shapes of the ZnSnO$_3$ cores 510' and 510'' and the ZnO shells 520' and 520'' are only examples, and the present invention is not limited thereto. Thus, the ZnSnO$_3$ cores 510' and 510'' and the ZnO shells 520' and 520'' may be modified in various shapes according to growth conditions.

Hereinafter, a method of forming a ZnSnO$_3$/ZnO nanowire having a core-shell structure and a method of forming a ZnSnO$_3$ nanowire using thermal CVD will be described.

Figure 8:
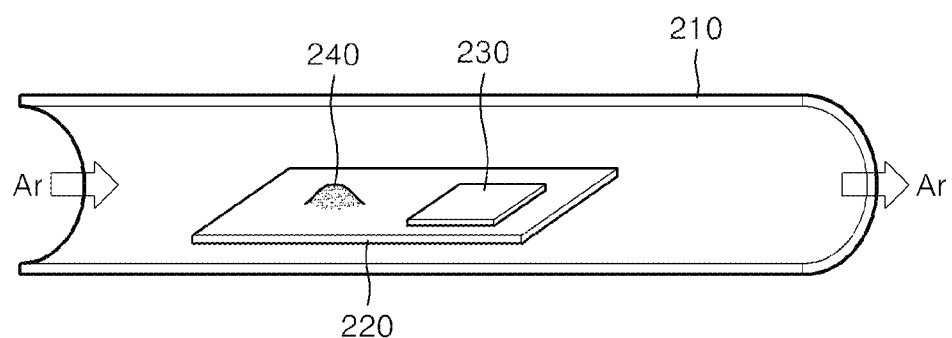
FIG. 8 illustrates a method of forming ZnSnO₃ nanowires and a method of ZnSnO₃/ZnO nanowires having a core-shell structure by using thermal CVD, whereby an inside of a cut furnace is shown, according to an exemplary embodiment.

FIG. 8 illustrates a method of forming ZnSnO$_3$ nanowires and a method of forming ZnSnO$_3$/ZnO nanowires having a core-shell structure by using thermal CVD, in which an inside of a cross-section of a furnace 210 is schematically shown, according to an exemplary embodiment.

Referring to FIG. 8, a boat 220 is inserted in the inside of the furnace 210 from outside the furnace, and powder 240 that is formed by mixing predetermined materials and a substrate 230 are disposed on the boat 220 to be spaced apart from each other by a predetermined distance. Here, the mixed powder 240 may be formed by mixing ZnO powder, SnO powder, and carbon powder at a predetermined ratio. For example, the ZnO powder, the SnO powder, and the carbon powder may be mixed at a weight ratio of approximately 1:3:8. However, this is only an example, and the present embodiment is not limited thereto. Thus, growth conditions of the ZnSnO$_3$/ZnO nanowires (see 600 of FIG. 10) may be modified variously by adjusting the weight ratio described above.

The substrate 230 may be a substrate formed of various materials. For example, the substrate 230 may be a monocrystalline Si substrate, a sapphire substrate, a ZnO substrate, or a ZnSnO$_3$ substrate. However, the present embodiment is not limited thereto. In this way, if a monocrystalline Si substrate, a sapphire substrate, a ZnO substrate, or a ZnSnO$_3$ substrate is used as the substrate 230, the growth direction of the ZnSnO$_3$/ZnO nanowires 600 may be controlled based on the relationship of crystal orientation between the substrate 230 and the ZnSnO$_3$/ZnO nanowires 600 to be grown. Thus, the ZnSnO$_3$/ZnO nanowires 600 may be grown perpendicular to the substrate 230 or inclined from the substrate 230 at a desired angle.

Figure 9:
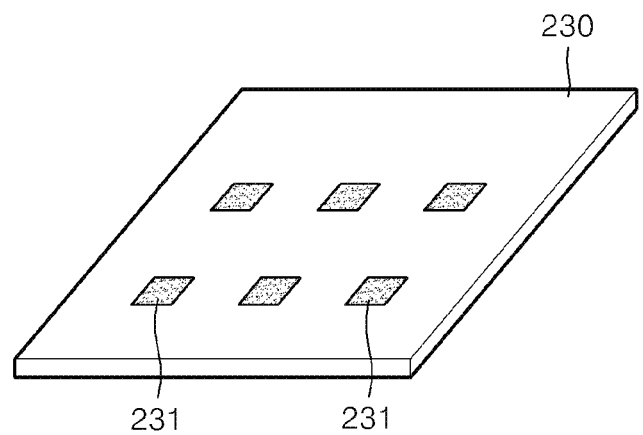
FIG. 9 illustrates a catalyst layer formed on a substrate illustrated in FIG. 8.

A catalyst layer (see 231 of FIG. 9) may be further formed on the substrate 230 to promote growth of the ZnSnO$_3$/ZnO nanowire 600. The catalyst layer 231 may include a noble metal, such as silver (Au), a transition metal, or a transition metal oxide. The catalyst layer 231 may include Zn, ZnO, or ZnSnO$_3$. If the catalyst layer 231 is formed of these materials, the growth direction of the ZnSnO$_3$/ZnO nanowires 600 may be controlled. Thus, the ZnSnO$_3$/ZnO nanowires 600 may be grown perpendicular to the substrate 230 or inclined from the substrate 230 at a desired angle. The catalyst layer 231 may also be formed to cover the substrate 230 or on the substrate 230 in a predetermined pattern shape. FIG. 9 illustrates an example of the catalyst layer 231 formed on the substrate 230 in rectangular patterns. However, the present embodiment is not limited thereto, and the pattern shape of the catalyst layer 231 may be modified variously.

The mixed powder 240 and the substrate 230 may be disposed on the boat 220 to be spaced apart from each other by a predetermined distance. For example, a distance at which the mixed powder 240 and the substrate 230 are spaced apart from each other may be approximately 1 cm. However, the present embodiment is not limited thereto, and a distance between the mixed powder 240 and the substrate 230 may be modified variously.

Next, the temperature of the inside of the furnace 210 is increased to heat the mixed powder 240 up to a first temperature. Here, for example, the first temperature may be approximately 1000° C. However, the present embodiment is not limited thereto, and the first temperature may be modified variously. The first temperature may range, for example, from 800° C. to 1200° C., preferably, from 900° C. to 1100° C. When the mixed powder 240 is heated up to the first temperature, the mixed powder 240 vaporizes and starts to decompose. The temperature of the inside of the furnace 210 is maintained at 1000° C. for a predetermined amount of time while the ZnSnO$_3$/ZnO nanowires (see 600 of FIG. 10) having a core-shell structure including the ZnSnO$_3$ core (see 610 of FIG. 10) and the ZnO shell (see 620 of FIG. 10) is grown on the substrate 230. A time at which the first temperature is maintained, may be approximately 2 hours, for example. However, the present embodiment is not limited thereto, and the time at which the first temperature is maintained, may be modified variously. As described above, the ZnSnO$_3$ core 610 has a Perovskite crystal structure and is formed in a nanowire shape. The ZnO shell 620 has a hexagonal crystal structure and surrounds the outer surface of the ZnSnO$_3$ core 610. The ZnSnO$_3$/ZnO nanowires 600 having a core-shell structure may be formed to have various shapes according to growth conditions.

An inert gas may be flown into the inside of the furnace 210 to prevent an impurity from being flown into the ZnSnO$_3$/ZnO nanowires 600 while the ZnSnO$_3$/ZnO nanowires 600 having a core-shell structure is grown. The inert gas may be flown into the inside of the furnace 210 after the mixed powder 240 is heated up to a second temperature that is lower than the first temperature. Here, the second temperature may be approximately 300° C., for example, and the present embodiment is not limited thereto. The inert gas may be argon (Ar) gas, for example, as shown in FIG. 8. However, the present embodiments not limited thereto, and other gases than Ar gas may be used as the inert gas. The second temperature may range, for example, from 200° C. to 400° C., preferably from 260° C. to 330° C.

Figure 10:
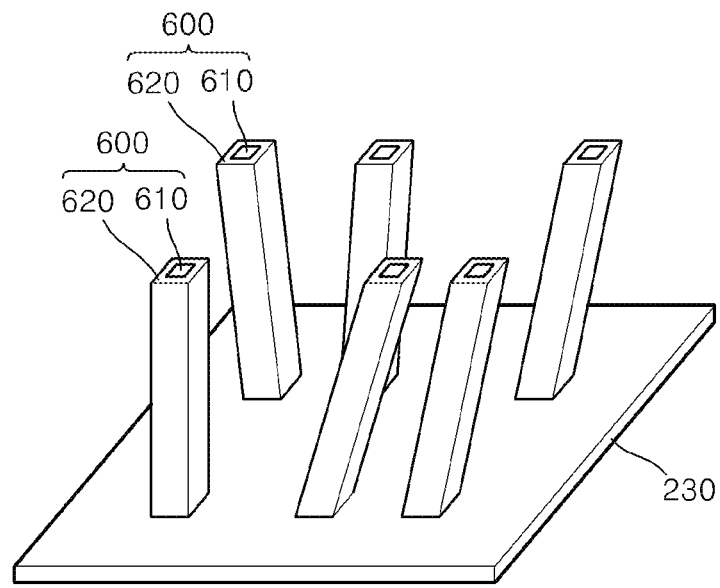
FIG. 10 illustrates an example of ZnSnO₃/ZnO nanowires having a core-shell structure that is grown on the substrate of FIG. 8.

As described above, when the ZnSnO$_3$/ZnO nanowires 600 are grown at the first temperature for a predetermined amount of time and then the furnace 210 is cooled, for example, is naturally cooled, the ZnSnO$_3$/ZnO nanowires 600 having a core-shell structure of which growth is completed are arranged on the substrate 230. The ZnSnO$_3$/ZnO nanowire 600 having a core-shell structure has more excellent piezoelectric characteristics than those of the ZnO nanowire, as described above. FIG. 10 illustrates the $ZnSnO_3$/ZnO nanowires 600 having a core-shell structure formed on the substrate 230 by using thermal CVD. In FIG. 10, the $ZnSnO_3$ core 610 and the ZnO shell 620 have a rectangular cross-section. As illustrated in FIG. 10, the $ZnSnO_3$/ZnO nanowires 600 may be arranged perpendicular to or inclined from the substrate 230. If a monocrystalline Si substrate, a sapphire substrate, a ZnO substrate, or a $ZnSnO_3$ substrate is used as the substrate 230 or Zn, ZnO, or $ZnSnO_3$ is used in forming the catalyst layer (see 231 of FIG. 9), the growth direction of the $ZnSnO_3$/ZnO nanowires 600 may be controlled. Thus, the $ZnSnO_3$/ZnO nanowires 600 may be formed on the substrate 230 to be perpendicular to or inclined from the substrate 230 at a desired angle.

Figure 11:
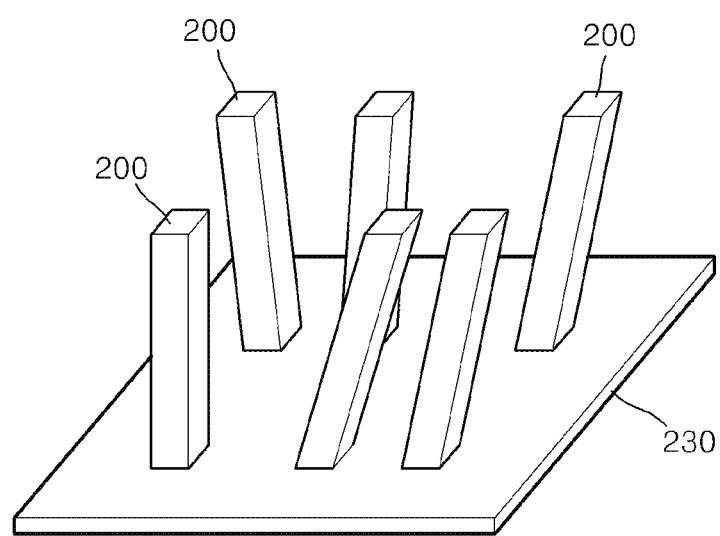
FIG. 11 illustrates an example of ZnSnO₃ nanowires having a core-shell structure that is grown on the substrate of FIG. 8.

The $ZnSnO_3$ nanowires may be formed using thermal CVD, similar to the $ZnSnO_3$/ZnO nanowires 600 described above. That is, by controlling growth conditions of the $ZnSnO_3$ nanowires, for example, a mixture ratio of the ZnO powder, the SnO powder, and the carbon powder in the mixed powder 240, a distance between the mixed powder 240 and the substrate 230, a vaporization temperature of the mixed powder 240, a time for maintaining the vaporization temperature of the mixed powder 240, or the like, in thermal CVD described above, only the $ZnSnO_3$ nanowires (see 200 of FIG. 11) may be grown on the substrate 230. The $ZnSnO_3$ nanowire 200 has a Perovskite crystal structure that has excellent piezoelectric characteristics. FIG. 11 illustrates the $ZnSnO_3$ nanowires 200 formed on the substrate 230 by using thermal CVD. If a monocrystalline Si substrate, a sapphire substrate, a ZnO substrate, or a $ZnSnO_3$ substrate is used as the substrate 230 or Zn, ZnO, or $ZnSnO_3$ is used in forming the catalyst layer (see 231 of FIG. 9), the growth direction of the $ZnSnO_3$ nanowires 200 may be controlled. Thus, the $ZnSnO_3$ nanowires 200 may be formed on the substrate 230 to be perpendicular to or inclined from the substrate 230 at a desired angle.

Hereinafter, a nanogenerator using $ZnSnO_3$ nanowires and a nanogenerator including $ZnSnO_3$/ZnO nanowires having a core-shell structure, according to exemplary embodiments, will be described below.

Figure 12:
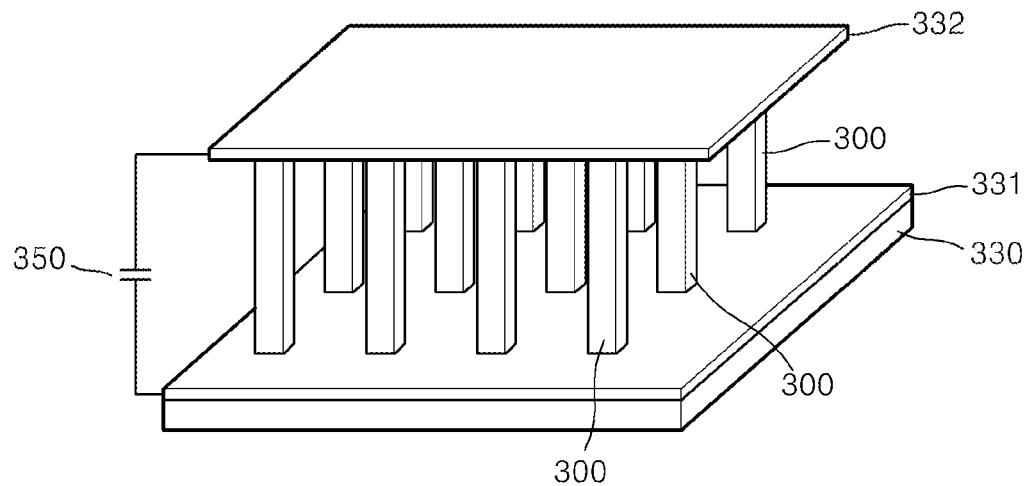
FIG. 12 illustrates a nanogenerator including ZnSnO₃ nanowires, according to an exemplary embodiment.

FIG. 12 illustrates a nanogenerator including $ZnSnO_3$ nanowires, according to an exemplary embodiment.

Referring to FIG. 12, a substrate 330 and a first electrode 332 are disposed spaced apart from each other by a predetermined distance, and a second electrode 331 is formed on the substrate 330. The substrate 330 may be a solid substrate, such as a glass substrate or a silicon substrate, or a flexible substrate, such as a plastic substrate or a fibre substrate. However, the present embodiment is not limited thereto, and a substrate formed of various materials may be used as the substrate 330. $ZnSnO_3$ nanowires 300 are disposed between the first electrode 332 and the second electrode 331. The $ZnSnO_3$ nanowires 330 have a Perovskite crystal structure having excellent piezoelectric characteristics, as described above. The $ZnSnO_3$ nanowires 300 may be arranged perpendicular to the substrate 300 or inclined from the substrate 300 at a predetermined angle. The first and second electrodes 332 and 331 may be connected to an external load 350.

In the aforementioned structure, when the $ZnSnO_3$ nanowires 300 on the substrate 330 are moved due to an external mechanical force, for example, fine vibration, wind, sound or movement of the human body, the $ZnSnO_3$ nanowires 300 may be deformed. Thus, due to the piezoelectric characteristics of the $ZnSnO_3$ nanowires 300, a predetermined voltage is induced between the first and second electrodes 332 and 331 that are connected to both ends of the $ZnSnO_3$ nanowires 300.

As a result, electrical energy may be applied to the load 350 that is connected to the first and second electrodes 332 and 331. When the load 350 is a capacitor, for example, electrical energy generated by a nanogenerator may be stored in the capacitor. When the load 350 is a nanodevice, for example, electrical energy generated by the nanogenerator may be used in driving the nanodevice.

In this way, the nanogenerator illustrated in FIG. 12 may obtain a high output by using the $ZnSnO_3$ nanowires 300 having excellent piezoelectric characteristics. In addition, a piezoelectric material, such as PZT, includes Pb and thus is harmful to the human body. However, the $ZnSnO_3$ nanowires 300 are chemically stable and thus are harmless to the human body. Thus, a nanogenerator using the $ZnSnO_3$ nanowires 300 may be applied to the human body. In addition, when other nanodevices are driven by the nanogenerators using the $ZnSnO_3$ nanowires 300, the performance of the nanodevices may be improved and each of the nanodevices may be independently driven.

As described above, a plurality of $ZnSnO_3$ nanowires 300 are disposed between the first and second electrodes 332 and 331. However, one or more $ZnSnO_3$ nanowires 300 may be disposed between the first and second electrodes 332 and 331. In addition, when the substrate 330 includes a conductive material, for example, a silicon substrate, the substrate 330 serves as an electrode. Thus, in this case, the second electrode 331 may not be provided. If a monocrystalline Si substrate, a sapphire substrate, a ZnO substrate, or $ZnSnO_3$ substrate is used as the substrate 330 or Zn, ZnO, or $ZnSnO_3$ is used in forming a catalyst layer (not shown), the growth direction of the $ZnSnO_3$ nanowires 300 may be controlled. Thus, the $ZnSnO_3$ nanowires 300 may be arranged perpendicular to the substrate 330.

Figure 13:
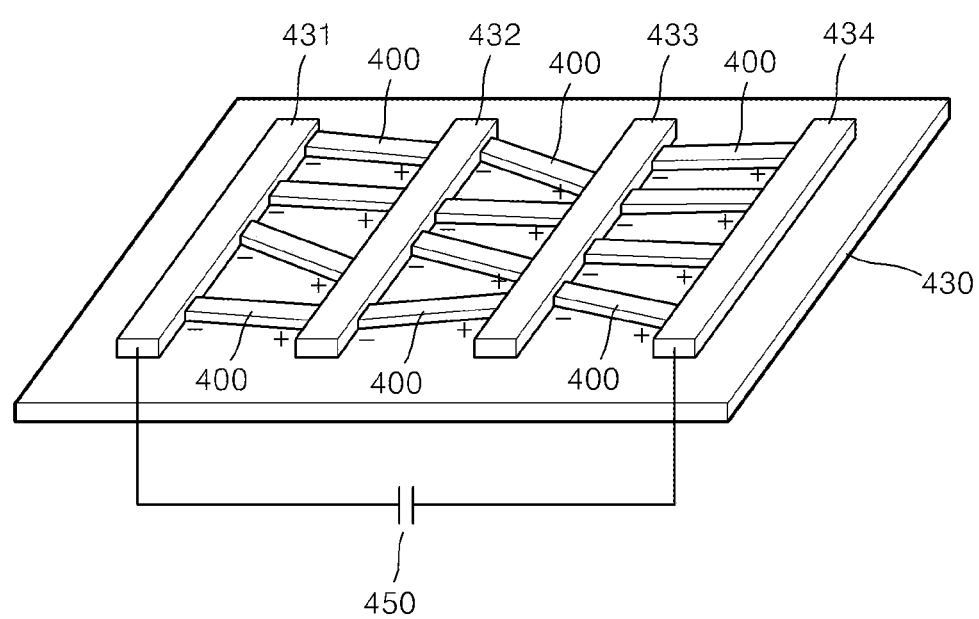
FIG. 13 illustrates a nanogenerator including ZnSnO₃ nanowires, according to an exemplary embodiment.

FIG. 13 illustrates a nanogenerator including a $ZnSnO_3$ nanowire, according to an exemplary embodiment.

Referring to FIG. 13, a plurality of electrodes 431, 432, 433, and 434 are disposed on a substrate 430 to be spaced apart from one another by a predetermined distance. The substrate 430 may be a solid substrate, such as a glass substrate or a silicon substrate, or a flexible substrate, such as a plastic substrate or a fibre substrate. However, the present embodiment is not limited thereto, and a substrate formed of various materials may be used as the substrate 430. The plurality of electrodes 431, 432, 433, and 434 may be disposed on the substrate 430 to be parallel to one another by a predetermined distance. At least one $ZnSnO_3$ nanowire 400 is disposed between the electrodes 431, 432, 433, and 434. The $ZnSnO_3$ nanowires 400 may be disposed perpendicular to the electrodes 431, 432, 433, and 434 or inclined from the electrodes 431, 432, 433, and 434 at a predetermined angle. The electrodes 431, 432, 433, 434 may be connected to one another in series due to the $ZnSnO_3$ nanowire 400. The outermost electrode 431 and 434 from among the electrodes 431, 432, 433, and 434 may be connected to an external load 450. By connecting the electrodes 431, 432, 433, and 434 to one another in series in this way, a relatively high voltage may be obtained. FIG. 13 illustrates four electrodes 431, 432, 433, and 434 disposed on the substrate 430. However, the present embodiment is not limited thereto, and at least two electrodes may be disposed on the substrate 430.

In the aforementioned structure, when the $ZnSnO_3$ nanowires 400 on the substrate 430 are moved due to an external mechanical force, the $ZnSnO_3$ nanowire 400 may be deformed. Thus, due to the piezoelectric characteristics of the $ZnSnO_3$ nanowires 400, a predetermined voltage is induced between the electrodes 431, 432, 433, and 434 that are connected to the $ZnSnO_3$ nanowires 400. As a result, electrical energy may be applied to the load 450 that is connected to the outermost electrodes 431 and 434 that. Here, even when the amount of current generated between two adjacent electrodes 431 and 432 or 433 and 434 is small, all of the electrodes 431, 432, 433, and 434 are connected to one another in series. Thus, as the number of the electrodes increases, a relatively high voltage is induced between the electrodes so that a relatively high output may be obtained from the nanogenerator. When the load 450 is a capacitor, for example, electrical energy generated by a nanogenerator may be stored in the capacitor. When the load 450 is a nanodevice, for example, electrical energy generated by the nanogenerator may be used in driving the nanodevice.

Figure 14:
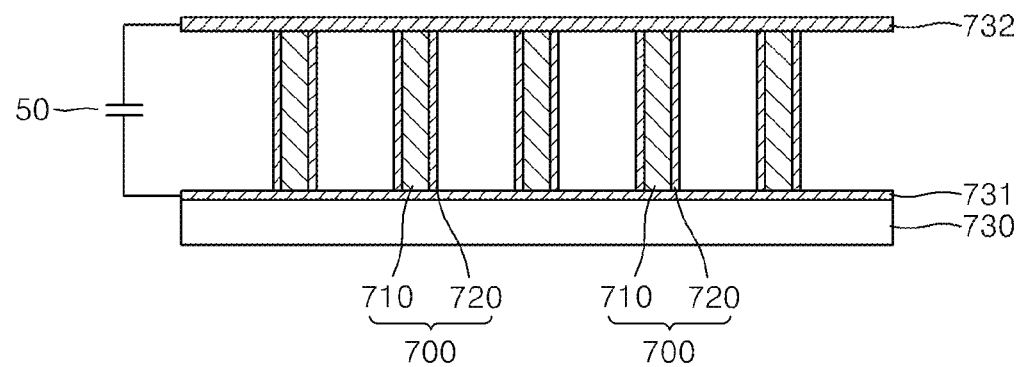
FIG. 14 illustrates a nanogenerator including ZnSnO₃/ZnO nanowires having a core-shell structure, according to an exemplary embodiment.

FIG. 14 illustrates a nanogenerator including $ZnSnO_3/ZnO$ nanowires having a core-shell structure, according to an exemplary embodiment. A cross-section when the nanogenerator is viewed from a front direction is shown in FIG. 14.

Referring to FIG. 14, a substrate 730 and a first electrode 732 are disposed spaced apart from each other by a predetermined distance, and a second electrode 731 is formed on the substrate 730. The substrate 730 may be a solid substrate, such as a glass substrate or a silicon substrate, or a flexible substrate, such as a plastic substrate or a fibre substrate. However, the present embodiment is not limited thereto, and a substrate formed of various materials may be used as the substrate 730. $ZnSnO_3/ZnO$ nanowires 700 having a core-shell structure are disposed between the first electrode 732 and the second electrode 731. Each of the $ZnSnO_3/ZnO$ nanowires 700 may include a $ZnSnO_3$ core 710 and a ZnO shell 720. The $ZnSnO_3$ core 710 has a nanowire shape and has a Perovskite crystal structure. The ZnO shell 720 surrounds an outer surface of the $ZnSnO_3$ core 710 and has a hexagonal crystal structure. The $ZnSnO_3/ZnO$ nanowires 700 having a core-shell structure may have more excellent piezoelectric characteristics than those of ZnO nanowires. The $ZnSnO_3/ZnO$ nanowires 700 may be arranged perpendicular to the substrate 730 or inclined from the substrate 730 at a predetermined angle. The first and second electrodes 732 and 731 may be connected to an external load 750.

In the aforementioned structure, when an external mechanical force is applied to the $ZnSnO_3/ZnO$ nanowires 700 having a core-shell structure on the substrate 730, a voltage is induced between the first and second electrodes 732 and 731 due to the piezoelectric characteristics of the $ZnSnO_3/ZnO$ nanowires 700. As a result, electrical energy may be applied to the load 750 that is connected to the first and second electrodes 732 and 731. Here, when the load 750 is a capacitor, for example, electrical energy generated by a nanogenerator may be stored in the capacitor, and when the load 750 is a nanodevice, for example, electrical energy generated by a nanogenerator may be used in driving the nanodevice.

In this way, the nanogenerator illustrated in FIG. 14 may obtain a high output by using the $ZnSnO_3/ZnO$ nanowires 700, and the $ZnSnO_3/ZnO$ nanowires 700 are chemically stable and thus may be applied to the human body. In addition, if other nanodevices are driven by the nanogenerators using the $ZnSnO_3/ZnO$ nanowires 700, the performance of the nanodevices may be improved and each of the nanodevices may be independently driven.

As described above, a plurality of $ZnSnO_3/ZnO$ nanowires 700 are disposed between the first and second electrodes 732 and 731. However, one or more $ZnSnO_3/ZnO$ nanowires 700 may be disposed between the first and second electrodes 732 and 731. In addition, when the substrate 730 includes a conductive material, for example, a silicon substrate, the substrate 730 may serve as an electrode. Thus, in this case, the second electrode 731 may not be provided. If a monocrystalline Si substrate, a sapphire substrate, a ZnO substrate, or $ZnSnO_3$ substrate is used as the substrate 730 or Zn, ZnO, or $ZnSnO_3$ is used in forming a catalyst layer (not shown), the growth direction of the $ZnSnO_3/ZnO$ nanowires 700 may be controlled. Thus, the $ZnSnO_3/ZnO$ nanowires 700 may be arranged perpendicular to the substrate 730.

Figure 15:
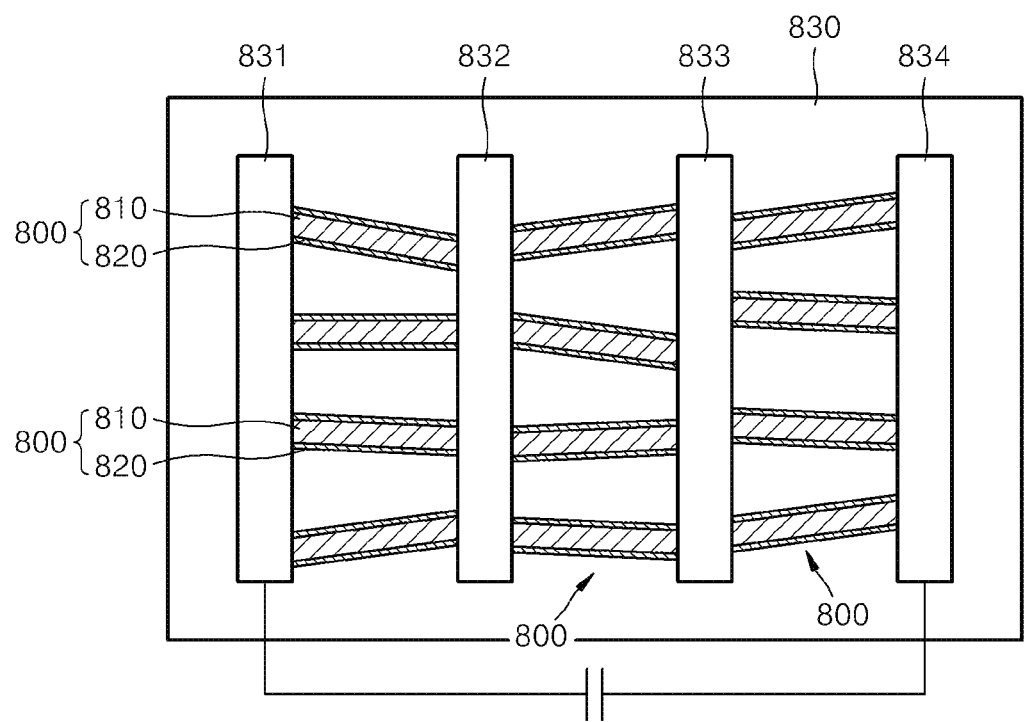
FIG. 15 illustrates a nanogenerator including ZnSnO₃/ZnO nanowires having a core-shell structure, according to an exemplary embodiment.

FIG. 15 illustrates a nanogenerator including $ZnSnO_3/ZnO$ nanowires having a core-shell structure, according to an exemplary embodiment. A cross-section when the nanogenerator is viewed from a top direction is shown in FIG. 15.

Referring to FIG. 15, a plurality of electrodes 831, 832, 833, and 834 are disposed on a substrate 830 to be spaced apart from one another by a predetermined distance. The substrate 830 may be a solid substrate, such as a glass substrate or a silicon substrate, or a flexible substrate, such as a plastic substrate or a fibre substrate. However, the present embodiment is not limited thereto, and a substrate formed of various materials may be used as the substrate 830. The electrodes 831, 832, 833, and 834 may be disposed on the substrate 830 to be parallel to one another by a predetermined distance. $ZnSnO_3/ZnO$ nanowires 800 having a core-shell structure are disposed between the electrodes 831, 832, 833, and 834. Here, each of the $ZnSnO_3/ZnO$ nanowires 800 may include a $ZnSnO_3$ core 810 and a ZnO shell 820. The $ZnSnO_3/ZnO$ nanowires 800 may be disposed perpendicular to the electrodes 831, 832, 833, and 834 or inclined from the electrodes 831, 832, 833, and 834 at a predetermined angle. In addition, the electrodes 831, 832, 833, and 834 that are connected by the $ZnSnO_3/ZnO$ nanowires 800 may be connected to one another in series. The outermost electrodes 831 and 834 from among the electrodes 831, 832, 833, and 834 may be connected to an external load 850. By connecting the electrodes 831, 832, 833, and 834 to one another in series, a relatively high voltage may be obtained. FIG. 15 illustrates four electrodes 831, 832, 833, and 834 disposed on the substrate 830. However, the present embodiment is not limited thereto, and at least two electrodes may be disposed.

In the aforementioned structure, when an external mechanical force is applied to the $ZnSnO_3/ZnO$ nanowires 800 having a core-shell structure on the substrate 830, a voltage is induced between the electrodes 831 and 832 or the electrodes 833 and 834 due to the piezoelectric characteristics of the $ZnSnO_3/ZnO$ nanowires 800. As a result, electrical energy may be applied to the load 850 that is connected to the outermost electrodes 831 and 834. Here, even when the amount of current generated between two adjacent electrodes 831 and 832 or 833 and 834 is small, all of the electrodes 831, 832, 833, and 834 are connected to one another in series. Thus, as the number of the electrodes increases, a high voltage is induced therebetween so that a relatively high output may be obtained from the nanogenerator. When the load 850 is a capacitor, for example, electrical energy generated by the nanogenerator may be stored in the capacitor, and when the load 850 is a nanodevice, for example, electrical energy generated by the nanogenerator may be used in driving the nanodevice. As described above, exemplary embodiments of the nanogenerator using $ZnSnO_3$ nanowires and the nanogenerator using $ZnSnO_3/ZnO$ nanowires having a core-shell structure have been described. Besides, $ZnSnO_3$ nanowires and $ZnSnO_3/ZnO$ nanowires having a core-shell structure may be applied to nanogenerators having various other shapes.

According to exemplary embodiments, a $ZnSnO_3$ nanowire and a $ZnSnO_3/ZnO$ nanowire having a core-shell structure that have more excellent piezoelectric characteristics than a ZnO nanowire may be implemented. Thus, by manufacturing a nanogenerator using the $ZnSnO_3$ nanowires or the $ZnSnO_3/ZnO$ nanowires, electrical energy may be efficiently extracted from mechanical energy generated due to fine vibration or movement. In addition, by driving nanodevices using the nanogenerators, the performance of the nanodevices may be improved and each of the nanodevices may be independently driven. In addition, the $ZnSnO_3$ nanowires or the $ZnSnO_3$/ZnO nanowires are chemically stable so that a nanogenerator using the $ZnSnO_3$ nanowires or the $ZnSnO_3$/ZnO nanowires may be applied to the human body.

While the present invention has been particularly shown and described with reference to exemplary embodiments thereof, it will be understood by those of ordinary skill in the art that various changes in form and details may be made therein without departing from the spirit and scope as defined by the following claims.

What is claimed is:

1. A $ZnSnO_3$/ZnO nanowire comprising:
   a core comprising $ZnSnO_3$; and
   a shell that surrounds the core and comprises ZnO.

2. The $ZnSnO_3$/ZnO nanowire of claim 1, wherein the $ZnSnO_3$ has a Perovskite crystal structure, and the ZnO has a hexagonal crystal structure.

3. The $ZnSnO_3$/ZnO nanowire of claim 1, wherein the $ZnSnO_3$/ZnO nanowire is formed by thermal chemical vapor deposition.

4. A nanodevice comprising the $ZnSnO_3$/ZnO nanowire of claim 1.

* * * * *